(12) United States Patent
Murai et al.

(10) Patent No.: US 6,285,116 B1
(45) Date of Patent: Sep. 4, 2001

(54) PIEZOELECTRIC ELEMENT

(75) Inventors: Atsushi Murai; Masayuki Kobayashi, both of Kuwana (JP)

(73) Assignee: Denso Corporation (JP)

( * ) Notice: Subject to any disclaimer, the term of this patent is extended or adjusted under 35 U.S.C. 154(b) by 0 days.

(21) Appl. No.: 09/665,076

(22) Filed: Sep. 19, 2000

(30) Foreign Application Priority Data

Sep. 20, 1999 (JP) .................................................. 11-265050
Jun. 29, 2000 (JP) .................................................. 12-196006

(51) Int. Cl.$^7$ ................................................. H01L 41/04
(52) U.S. Cl. ............................................................ 310/328
(58) Field of Search .................................. 310/328, 359, 310/365, 366

(56) References Cited

U.S. PATENT DOCUMENTS 5,291,090  *  3/1994  Dias ....................... 310/334
5,650,685  *  7/1997  Kosinski et al. ...................... 310/316
5,905,627  *  5/1999  Brendel et al. ...................... 361/302

FOREIGN PATENT DOCUMENTS 0 871 230 A1   10/1998  (EP) .
10308542A      11/1998  (JP) .
12-296612   *  10/2000  (JP) .

* cited by examiner

Primary Examiner—Elvin Enad
Assistant Examiner—Peter Medley
(74) Attorney, Agent, or Firm—Pillsbury Winthrop LLP

(57) ABSTRACT

In a piezoelectric element having a laminated body 11 of piezoelectric layers, wherein an electric voltage is applied across internal electrodes 121 and 122 of positive and negative polarities formed between the layers from external electrodes 131 and 132 so as to form an electric field within the piezoelectric layers to thereby displace the piezoelectric layers, an inductor is provided at an intermediate position along a line connecting the external electrode of one polarity and the internal electrode 121 of the one polarity, whereby no inductor is needed in a driving circuit 7 even when there are provided numerous piezoelectric elements or a common piezoelectric element only has to be provided in the driving circuit which is common to the respective piezoelectric elements, thus making it possible to drive the piezoelectric elements with a simple driving circuit.

10 Claims, 9 Drawing Sheets

PIEZOELECTRIC ELEMENT

BACKGROUND OF THE INVENTION

1. Field of the Invention

The present invention relates to a piezoelectric element for use in a piezoelectric injector.

2. Description of the Related Art

The piezoelectric element utilizes the piezoelectric effect of a piezoelectric material, and since it has a high response speed and uses no mechanical components, the piezoelectric element is used as an actuator in various fields. For instance, an injector utilizing the piezoelectric element has been developed for use, instead of a solenoid which utilizes an electromagnetic force, in driving a fuel injector to open or close in an internal combustion engine of an automotive vehicle. FIG. 12 shows a piezoelectric element connected to a driving circuit. The piezoelectric element 91 has a laminated body 91a in which piezoelectric layers 911 and internal electrodes 912 are alternately laminated, whereby the piezoelectric element 91 is constructed so as to be displaced by applying a voltage between the internal electrodes 912. The application of the voltage to the piezoelectric element 91 is implemented from a current source 921 for the driving circuit 92 which is constituted by a capacitor or the like via external electrodes 914 formed on side surfaces of the laminated body 91a.

Over-charging the piezoelectric layers 91 may cause, immediately the piezoelectric layers 911 are charged, an elongation thereof which is greater than required, leading a failure of the piezoelectric layer 911. To cope with this, an inductor 922 is provided in series with the piezoelectric element 91 at an intermediate position along the length of a line 93 for suppressing the over-charging of the piezoelectric layers. However, it is necessary to avoid the interference, by the inductor utilizing electromagnetic induction, with other coil components or the like, and this imposes a limitation to the layout of components in the driving circuit, thus there is no way to prevent the enlargement of the driving circuit. Moreover, especially in the event that the number of inductors increases as the number of piezoelectric elements does, as seen in a case where a plurality of piezoelectric elements of different specifications are driven, the driving circuit 92 becomes larger.

The present invention was made in view of the aforesaid situation, and an object thereof is to provide a piezoelectric element which can be driven with a small and simple driving circuit.

SUMMARY OF THE INVENTION

According to a first aspect of the present invention, there is provided a piezoelectric element wherein an inductor is provided at an intermediate position along a line connecting an external electrode of one polarity with an internal electrode of the one polarity, and, via the inductor, a voltage is applied across internal electrodes formed between piezoelectric layers.

According to this construction, no inductor is required to be provided in a driving circuit for the piezoelectric element. Alternatively, there has to be provided in the driving circuit only one inductor which is connected in series with inductors provided in the piezoelectric elements and is common to the respective piezoelectric elements, thereby making it possible to make the driving circuit small and simple.

According to a second aspect of the present invention, there is provided a piezoelectric element as set forth in the first aspect, wherein the inductor comprises a plurality of insulating layers for incorporation with the laminated body of piezoelectric layers, and wherein a conductor pattern is formed, of a conductive material, into a spiral or a loop and is provided between the respective insulating layers.

Since the conductive pattern is formed between the respective insulating layers, space can be saved. Additionally, a method like the green sheet method which is common in the production of piezoelectric elements, can also be used for producing the inductor portion.

According to a third aspect of the present invention, there is provided a piezoelectric element as set forth in the second aspect, wherein the inductor comprises the conductive patterns and the insulating layers which are laminated alternately, the laminated conductive patterns being electrically connected in series with each other by means of a contact portion which penetrates the respective insulating layers.

According to this construction, the inductance of the inductor can be adjusted in response to the number of insulating layers and conductor patterns.

According to a fourth aspect of the present invention, there is provided a piezoelectric element as set forth in the second or third aspect, wherein a magnetic member is provided close to the conductor pattern between the insulating layers.

The magnetic permeability can be increased by provision of the magnetic member so as to increase the inductance while substantially maintaining the configuration of the inductor.

According to a fifth aspect of the present invention, there is provided an piezoelectric element as set forth in the fourth aspect, wherein the magnetic member is a magnetic material pattern formed between the insulating layers.

The magnetic material pattern can easily be formed using screen printing or the like.

According to a sixth aspect of the present invention, there is provided a piezoelectric element as set forth in the fourth aspect, wherein the magnetic member is a magnetic material core which penetrates the insulating layers.

According to this construction, a high magnetic permeability can be obtained.

According to a seventh aspect of the present invention, there is provided a piezoelectric element as set forth in the first aspect, wherein the inductor comprises three or more insulating layers that are laminated on one another so as to be incorporated with the laminated body of the piezoelectric layers, wherein a plurality of conductor patterns of a first kind, which are formed linearly of a conductive material, are provided in parallel between a first inter-layer portions of the insulating layers, while a plurality of conductor patterns, of a second kind which are formed linearly and diagonally relative to the conductor patterns of the first kind, are provided between second inter-layer portions in such a manner that each of the conductor patterns of the second kind extends from one end of one of two adjacent conductor patterns of the first kind to an opposite end of the other, whereby the respective conductor patterns of the first kind and the respective conductor patterns of the second kind are caused to electrically connect to each other at ends thereof by means of contact portions which penetrate the insulating layer.

Since the conductor patterns are formed between the insulating layers, the inductance of the inductor can freely be controlled in response to the number of conductor patterns while the number of laminated insulating layers and conductor patterns can remain as they are, whereby the space can advantageously be saved. Additionally, a method like the green sheet method which is common in production of piezoelectric elements can also be used.

According to an eighth aspect of the present invention, there is provided a piezoelectric element as set forth in any of the second to seventh aspects, wherein the insulating layers are constituted of the same material as the piezoelectric layers.

According to this construction, it is possible to reduce the production cost by reducing the number of kinds of materials used.

According to a ninth aspect of the present invention, there is provided a piezoelectric element as set forth in the second, third or seventh aspect, wherein the insulating layers are each constituted by a magnetic member.

According to this construction, it is possible to increase the inductance with the configuration of the inductor being maintained substantially as it is. Moreover, there is no need to provide a separate magnetic member, this eliminating a complicated production process which would otherwise be required.

According to a tenth aspect of the present invention, there is provided a piezoelectric element as set forth in any of the second to ninth aspects, wherein the insulating layers are laminated together with the piezoelectric layers so as to be a dummy layer covering the internal electrode in the uppermost piezoelectric layer.

According to this construction, the insulating layers for forming the inductor also function as a dummy layer for absorbing internal stress of the piezoelectric layer, and therefore, there is no need to provide a separate dummy layer, this simplifying in the construction of the piezoelectric element. Moreover, the dummy layers and the conductor patterns only have to be laminated on the piezoelectric layer or the internal electrode, and therefore, the same production process as that of the conventional piezoelectric elements can also be used, this leading to a simple production process.

DETAILED DESCRIPTION OF THE PREFERRED EMBODIMENTS (First Embodiment)

Figure 1:
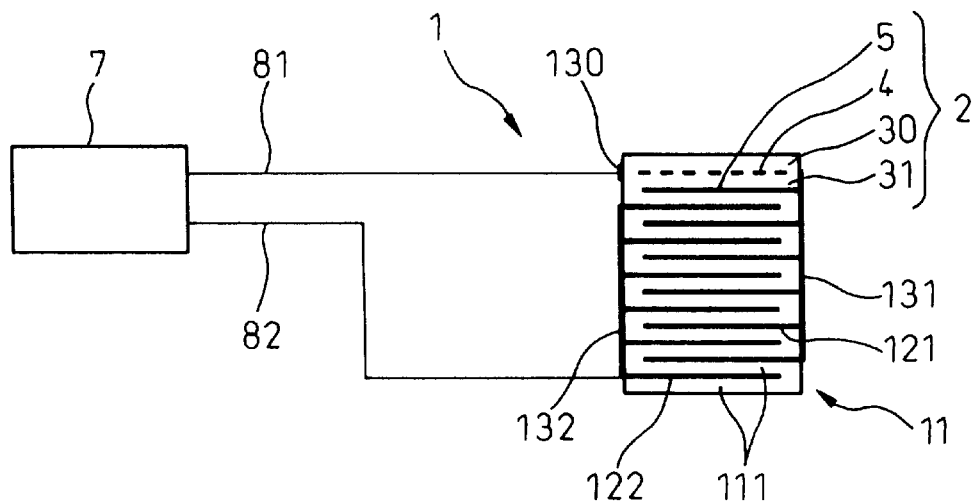
FIG. 1 is a diagram showing the construction of a piezoelectric element according to a first embodiment of the present invention which is connected to a driving circuit.
Figure 12:
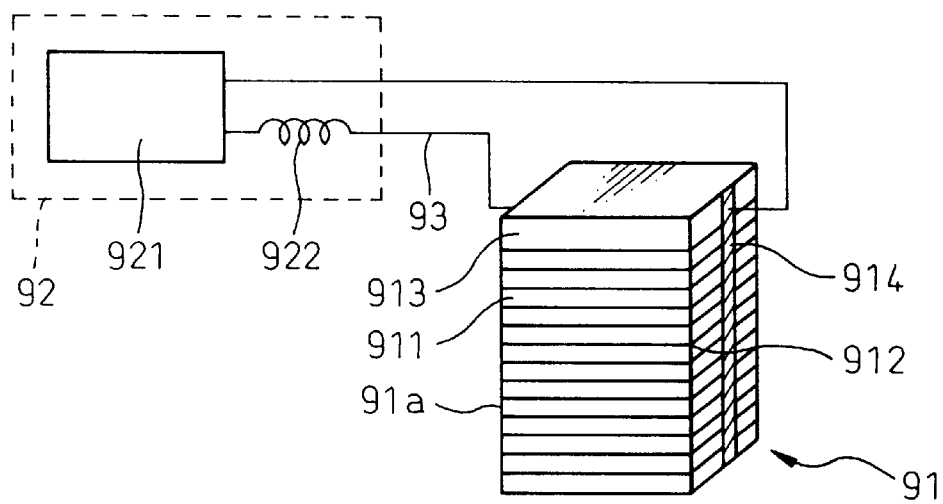
FIG. 12 is a diagram showing a representative example of conventional piezoelectric elements which is connected to a driving circuit.

FIG. 1 shows a piezoelectric element according to a first embodiment of the present invention which is connected to a driving circuit. The piezoelectric element 1 has a laminated body 11 constituted by piezoelectric layers 111, and positive and negative internal electrodes 121 and 122 are alternately formed between the piezoelectric layers 111, the piezoelectric layers 111 being polarized in a direction in which they are laminated. Lateral surface electrodes 130, 131 and 132 are formed on lateral surfaces of the laminated body 11. The respective internal electrodes 121 are electrically connected by the lateral electrode 131, and the respective internal electrodes 122 are electrically connected by the lateral electrode 132. The lateral electrode 130 is connected to a driving circuit 7 via a lead wire 81, and the lateral electrode 132 is connected to the driving circuit 7 via a lead wire 82, whereby the lateral electrodes 130 and 132 are made to function as external electrodes for applying a voltage across the internal electrodes 121 and 122. Note that the driving circuit 7 is constructed substantially identically to a current source (refer to FIG. 12) used to drive a conventional piezoelectric element which is provided with no inductor.

In the laminated body 11, two dummy layers 30 and 31 are formed on one of the internal electrodes 121 residing in the uppermost layer to cover the same from above, and a coil pattern 4 is formed therebetween. One end of the coil pattern 4 electrically connects to the external electrode 130, which is one of the external electrodes described above, and the other end thereof electrically connects to the internal electrode 121 of one polarity which resides in the uppermost layer via a contact portion 5 which penetrates the dummy layer 31. An inductor 2 is constituted by the dummy layers 30 and 31, the coil pattern 4 and the contact portion 5. Alternatively, in place of providing the contact portions, the other end of the coil pattern 4 may directly and electrically connect to the lateral electrode 131.

Described below will be a method for fabricating the piezoelectric element 1 and the detailed construction of the laminated body 11. The piezoelectric element 1 can be fabricated using a green sheet method which is widely used. To produce a green sheet, powders of lead oxide, zirconium oxide, titanium oxide, niobium oxide, strontium carbonate and the like, which become primary raw materials for a piezoelectric material, are weighed using a known method so as to obtain a desired composition. Additionally, in consideration of the evaporation of lead, the composition should be 1 to 2 percent richer in lead oxide content than a stoichiometric ratio for the mixing ratio composition. The composition is then dry blended and thereafter is preliminary calcined at 800 to 950 degrees C.

Following this, pure deionized water and a dispersant are added to the preliminary calcined powders so as to produce a slurry, and the slurry so produced is then wet ground using a pearl mill. A ground product so produced is then dried and powder degreased, and thereafter, a solvent, a binder, a plasticizer, a dispersant and the like are added thereto for mixing in a ball mill. A slurry so produced is then agitated with an agitator within a vacuum device for vacuum degassing and adjustment in viscosity.

Then, the slurry is molded into a green sheet of a certain thickness using a doctor blade device.

Figure 2A:
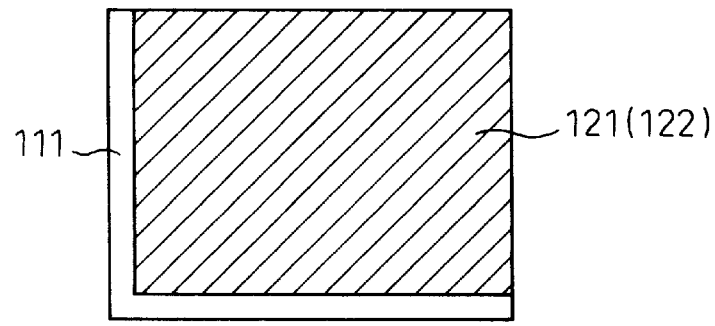
FIGS. 2A and 2B are plan views showing, respectively, green sheets for use in production of the above piezoelectric element.
Figure 2B:
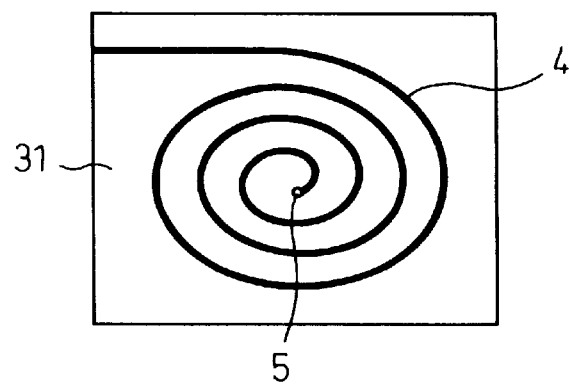

Next, a pattern is formed through screen printing on one side of a green sheet molded as described above using a paste comprising a mixture of silver and palladium which are mixed with, for example, a silver/palladium ratio=7/3 (hereinafter, referred to as Ag/Pd paste). FIGS. 2A and 2B show examples of green sheets on which pattern printing has been implemented. Note that green sheets for the piezoelectric layers and the dummy layers are substantially the same and therefore that the same reference numeral is imparted to those green sheets in the figures and descriptions to be made hereinafter.

In FIG. 2A showing a green sheet constituting a piezoelectric layer, a rectangular pattern 121(122) is formed substantially wholly on a surface of the green sheet 111 using the Ag/Pd paste in such a manner that the rectangular pattern so formed becomes slightly smaller than the whole area of the surface, so that the rectangular pattern constitutes the internal electrode 121 (122). Provided along two side edge portions intersecting at right angles with each other on the surface of the green sheet 111 is an L-shaped portion where the internal electrode 121 (122) is not formed, whereby the internal electrode 121 is caused to reach one of the opposed sides of the green sheet 111 but to terminate before it reaches the other side thereof.

In FIG. 2B showing a green sheet constituting the lower dummy layer, a coil pattern 4 is formed on a surface of the green sheet 31 using the Ag/Pd paste in such a manner as to extend spirally from a side edge of the green sheet 31 toward a central portion thereof.

At an end of the coil pattern 4 which is located at the spiral center thereof, a through hole is formed by punching in the green sheet 31 constituting the lower dummy layer, and the Ag/Pd paste is embedded in the through hole simultaneously with the screen printing of the coil pattern 4 to thereby form the contact portion 5.

Note that a required number of green sheets 111, on each of which the internal electrode 121 (122) is formed, are prepared for satisfying a predetermined number of lamination layers required based on a specified displacement amount, and a single green sheet on which the coil pattern 4 is formed is prepared. Additionally, a single green sheet on which no screen printing is provided is prepared as a green sheet for constituting the upper dummy layer.

Figure 3A:
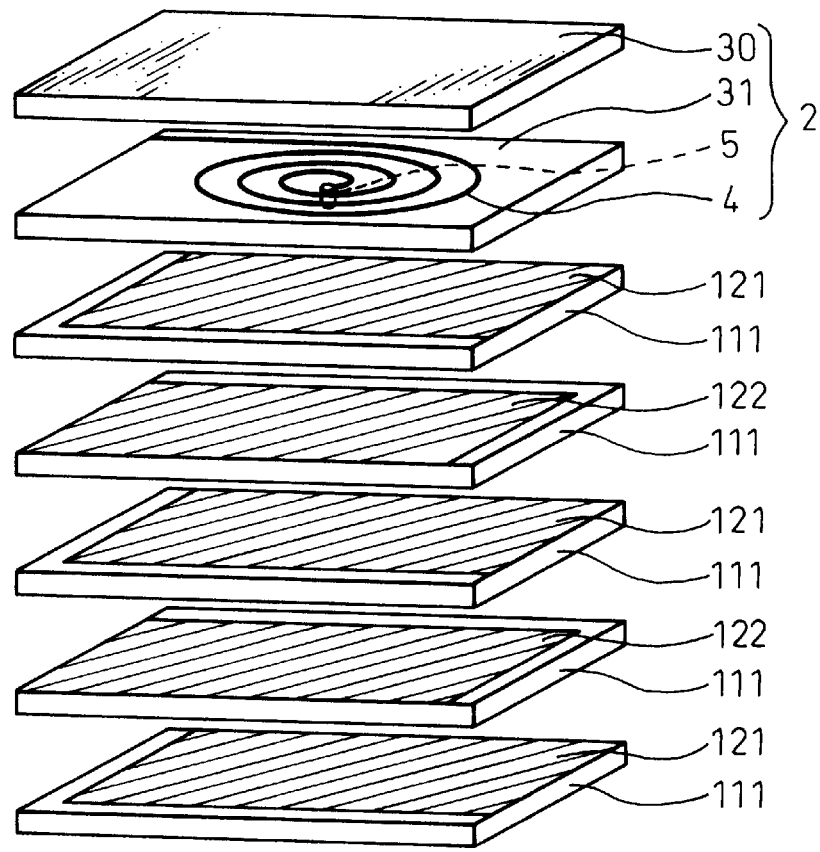
FIGS. 3A and 3B are perspective views showing, respectively, states in which the green sheets for use in production of the piezoelectric sheets are laminated.

Next, the green sheets 111, 31 and 30 are superposed on one another. FIG. 3A shows a state in which the green sheets 111, 31 and 30 are laminated, and the figure is substantially an exploded view of the laminated body 11. First, the green sheets on each of which the internal electrode 121 (122) is formed are superposed on one another. In superposing them, the green sheets 111 are superposed in such a manner that the non-electrode-formed portions of the green sheets so superposed take alternately a left-front position and a right-back position as viewed in the figure, whereby the internal electrodes reaching the right-hand side edges of the green sheets 111 as viewed in the figure constitute internal electrodes 121 of one polarity, while the internal electrodes reaching the left-hand side edges of the green sheets 111 as viewed in the figure constitute internal electrodes 122 of the other polarity.

Then, the green sheet 31 on which the coil pattern 4 is formed is superposed on the green sheets 111, when the coil pattern 4 and the internal electrode 121 in the uppermost layer are caused to electrically conduct to each other via the contact portion 5.

Figure 3B:
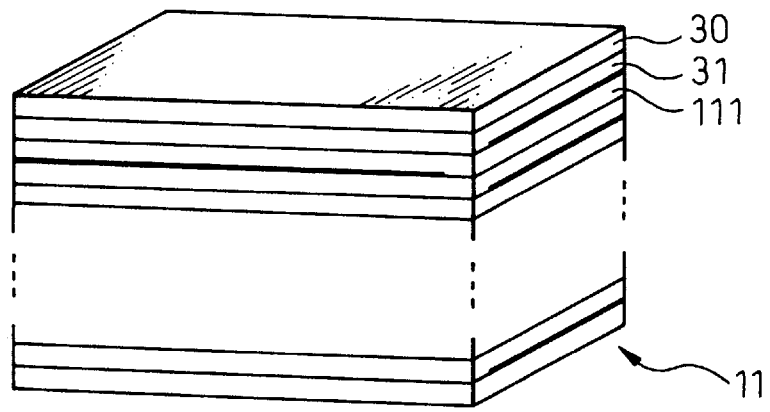

Next, the green sheet 30 is superposed so as to cover the coil pattern 4. Thus, the laminated body 11 shown in FIG. 3B is obtained.

Following this, after the superposed green sheets of the laminated body 11 are thermally pressure secured to one another with a hot-water rubber press, the laminated body 11 is degreased at a temperature ranging from 400 to 700 degrees C in an electric oven and then is calcined at a temperature ranging from 900 to 1200 degrees C.

Then, electrodes 130 to 132 are formed by applying and baking the Ag/Pd or Ag paste to lateral surfaces of the laminated body 11. The external electrode 130 of one polarity is formed at a position where one end of the coil pattern 4 is exposed. The external electrode 131 is formed at a position where the internal electrodes 121 of the one polarity are exposed, so that electric conduction is established between the internal electrodes 121. The external electrode 132 of the other polarity is formed at a position where the internal electrodes 122 of the other polarity are exposed, so that electric conduction is established between the internal electrodes 122.

Thereafter, the laminated body 11 on which the external electrodes are formed as described above is dipped in a bath of an insulating fluid and a D.C. voltage is applied from the external electrodes 130 and 132 across the internal electrodes 121 and 122 so as to polarize the piezoelectric layers 111 to thereby obtain the piezoelectric element 1.

When a voltage is applied across the external electrodes 130 and 132 of the piezoelectric element 1 from the driving circuit 7, there being generated therein an induction action, the inductor 2 limits electric current as does an inductor comprising a general solenoid coil, thereby suppressing the over-charging of the piezoelectric element 1.

Thus, since the conventional method for fabricating piezoelectric elements can be used as it is only by adding the pattern for the inductor to the patterns which are screen printed on the green sheets, the fabrication becomes easy and piezoelectric elements each provided with an inductor can be fabricated at a low cost. Consequently, a construction can be provided in which no inductor is required for the driving circuit as shown in FIG. 1, or the driving circuit is provided with a small inductor only.

Figure 4:
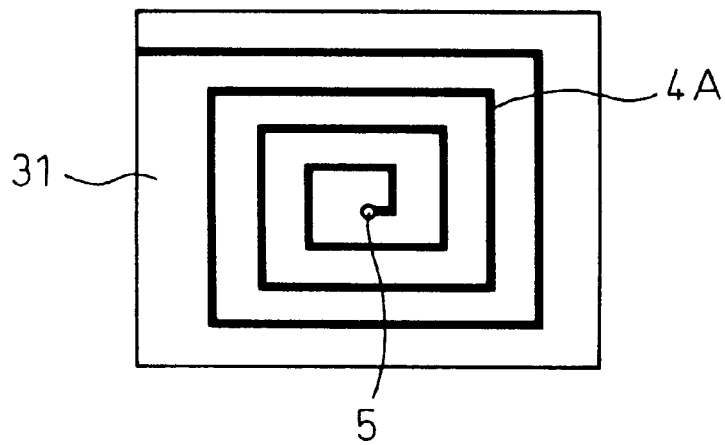
FIG. 4 is a plan view of a green sheet for use in production of a modified example according to the present invention.

Note that while the coil pattern 4 for the inductor 2 is constituted by a spiral, a coil pattern 4A may alternatively be used which is constituted by a square spiral as shown in FIG. 4.

Figure 5:
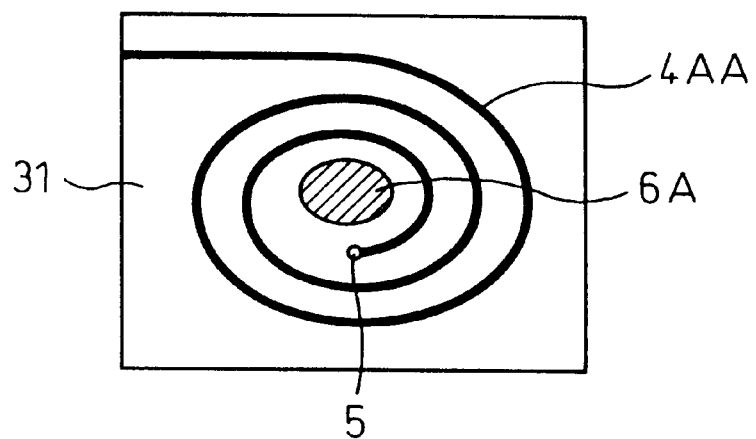
FIG. 5 is a plan view of a green sheet for use in production of another modified example according to the present invention.

Additionally, as shown in FIG. 5, the magnetic permeability of a portion where a magnetic flux is formed by the coil pattern 4 may be increased by disposing a magnetic material pattern 6A which is a magnetic member close to a coil pattern 4AA (in an illustrated example, by forming a magnetic material pattern 6A as an island disposed inward of the spiral coil pattern 4AA). This can increase the inductance of the inductor 2 while maintaining the configuration thereof. The magnetic material pattern 6A is formed by applying, for instance, a magnetic powder or the like using the screen printing.

In addition, while the same green sheet as that used for the piezoelectric layers is also used for the dummy layers 30 and 31 to thereby reduce the fabricating cost by preventing an increase in the number of kinds of fabricating materials, the dummy layers may be fabricated of different materials. For example, the dummy layers may be fabricated of an insulating magnetic material. The inductance of the inductor can be increased by increasing the magnetic permeability of the portion where the magnetic flux is formed by the coil pattern while the configuration of the inductor is maintained as it is.

(Second Embodiment)

Figure 6:
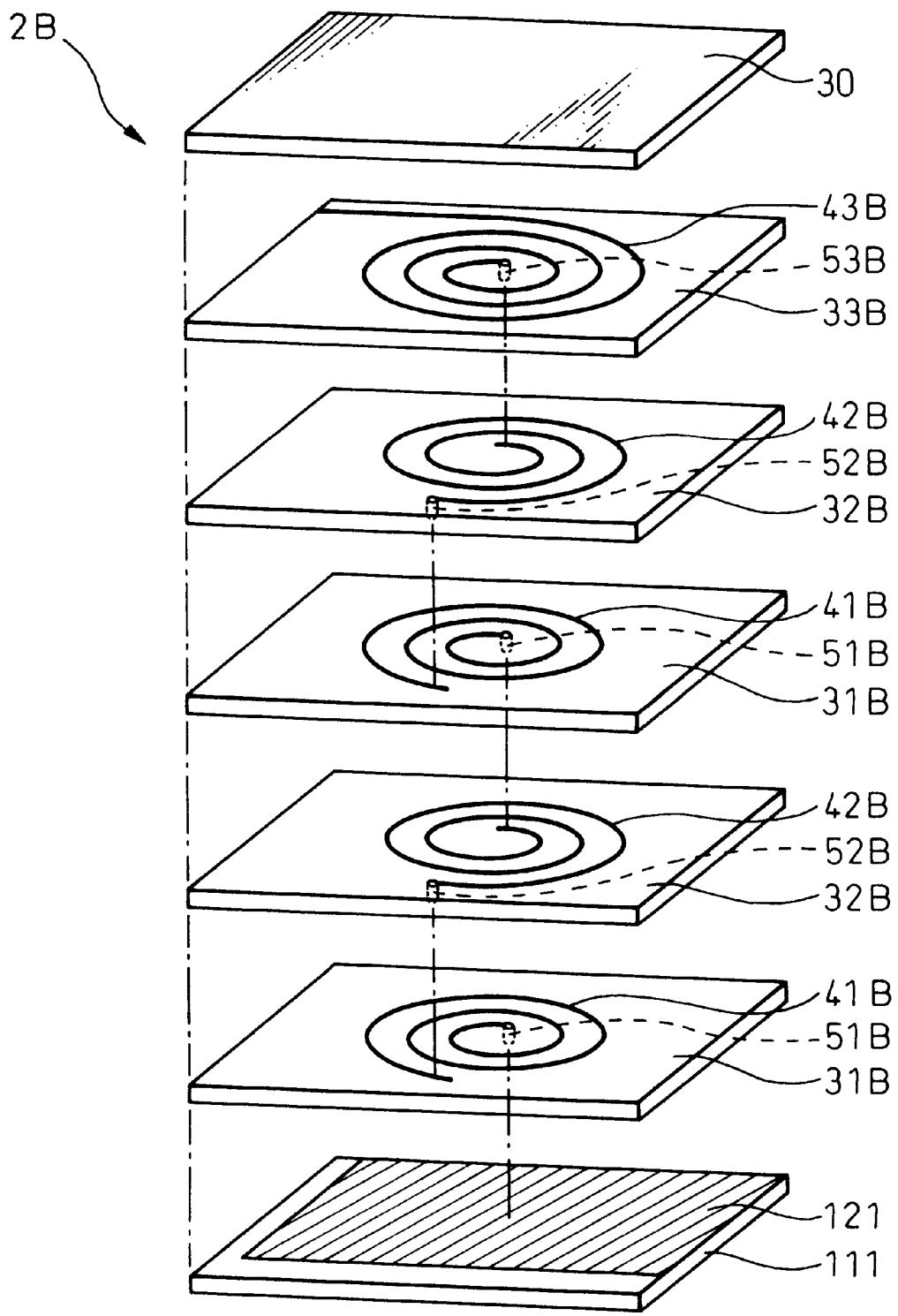
FIG. 6 is a perspective view showing a state in which green sheets are laminated when used in production of a piezoelectric element according to a second embodiment of the present invention.

A second embodiment of the present invention provides a piezoelectric element constructed similarly to that described in the first element thereof except the inductor, which is constructed differently in this embodiment. Thus, only those points different from the first embodiment will be described here. FIG. 6 shows a state in which green sheets are laminated in producing a piezoelectric element according to the second embodiment. This figure actually shows an exploded view of an inductor according to the second embodiment.

The same green sheets as those used in the piezoelectric layer 111 are used for green sheets 31B, 32B and 33B which constitute dummy layers, and they are obtained using the same production method as that described in the first embodiment. Coil patterns 41B, 42B and 43B, which are conductor patterns, are formed on the green sheets 31B to 33B using screen printing. The coil patterns 41B to 43B are each formed into a spiral pattern which extends from a side edge portion to a central portion of the respective green sheets 31B, 32B and 33B, in which the first coil pattern 41B coils clockwise and the second coil pattern 42B coils counterclockwise, and the coil patterns are formed so that central ends of the spiral patterns and outer peripheral ends thereof are situated at the same positions on the green sheets 31B and 32B. The third coil pattern 43B is an uppermost coil pattern, and as with that described in the first embodiment, an outer peripheral end thereof reaches a side edge of the green sheet 33B.

Laminated alternately on the piezoelectric layer 111 on which an internal electrode 121 of the uppermost layer is formed are the green sheet 31B on which the first coil pattern 41B is formed and the green sheet 32B on which the second coil pattern 42B is formed, and the green sheet 33B on which the third coil pattern 43B is formed is laminated thereon as an uppermost layer, whereby a plurality of coil patterns 41B to 43B are formed in a direction in which the green sheets 31B to 33B are laminated. Note that the third coil pattern 43B is formed such that it coils in an opposite direction to the direction in which the spiral pattern 42B coils which is formed on the green sheet 32B which is placed directly underneath the green sheet 33B having the third coil pattern 43B formed thereon.

Similarly to the first embodiment, contact portions 51B, 52B, 53B are formed in the green sheets 31B to 33B at the same time that the coil patterns 41B to 43B are screen printed. The contact portions 51B to 53B are formed only at one end of the respective coil patterns 41B to 43B and the positions where they are so formed differ depending on whether the coil patterns 41B to 43B coil clockwise or counterclockwise. In the illustrated example, the contact portions 51B and 53B are formed only at central ends of the spirals in the green sheets 31B and 33B on which the clockwise patterns 41B and 43B are formed, respectively, whereas the contact portion 52B is formed only at the outer peripheral end of the spiral in the green sheet 32B on which the counterclockwise pattern 42B is formed, so that the respective coil patterns 51B to 53B are electrically connected in series with one another to thereby form an inductor 2B.

Since in the coil patterns 41B to 43B connected in series one another, the clockwise coil and the counterclockwise coil are laminated alternately in a repeated fashion in the laminating direction as described above, electric currents coil and conduct in the same direction in the respective coil patterns 41B to 43B, whereby an inductor is formed which substantially has numerous coils in response to the number of laminated layers.

Thus, the inductance of the inductor can freely be set in response to the number of the dummy layers laminated. The spiral conductor patterns, of a limited number of kinds, only have to be printed on the separate green sheets which can be changed in number of laminations, and therefore, the production of the inductor can be facilitated.

(Third Embodiment)

Figure 7:
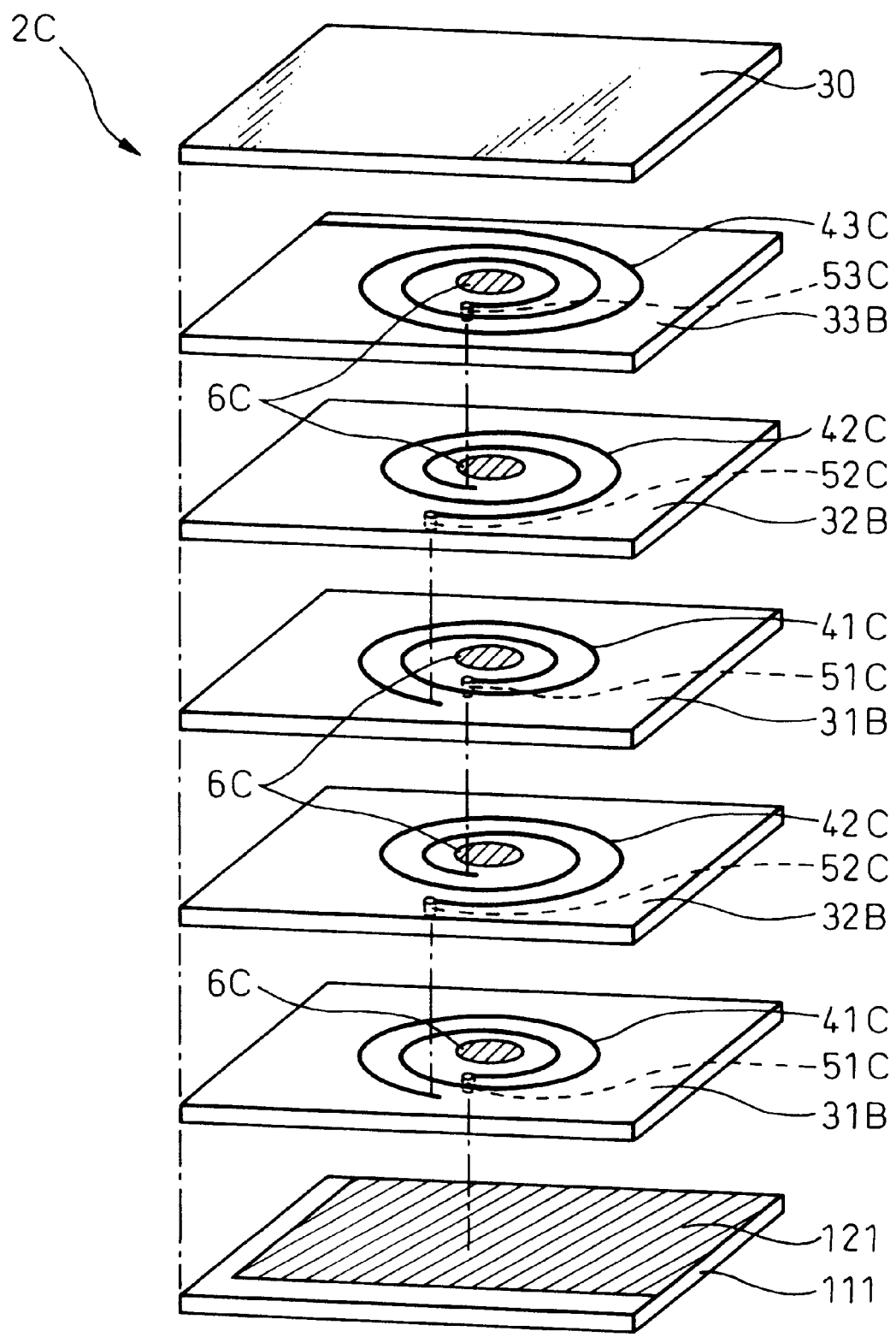
FIG. 7 is a perspective view showing a state in which green sheets are laminated when used in production of a piezoelectric element according to a third embodiment of the present invention.

A third embodiment of the present invention provides a piezoelectric element constructed similarly to that described in the second element thereof except for the inductor which is constructed differently in this embodiment. In the description of the modified example according to the first embodiment, while an inductor is described in which the magnetic member is provided inside the coil pattern to improve the permeability, the construction can also be applied to the construction according to the second embodiment in which the green sheets and the coil patterns are laminated in an alternate fashion. FIG. 7 shows a state in which green sheets are laminated in producing a piezoelectric element according to this embodiment. The figure is actually an exploded view of an inductor of the embodiment. In the figure, since portions with reference numerals like those used in the second embodiment function substantially similarly to those with the reference numerals in the second embodiment, only points different from the second embodiment will be described here.

An electrically insulating magnetic powder is applied, using the screen printing process, to substantially central portions of respective green sheets 31B to 33B which constitute dummy layers so as to form circular magnetic material patterns 6C. Next (or prior to the formation of the magnetic material patterns 6C), coil patterns 41C, 42C and 43C which are conductor patterns are formed using the screen printing process. The coil patterns 41C to 43C are each formed into a spiral shape so as to surround the magnetic material pattern 6C, and the coil patterns 41C and 43C formed on the green sheets 31B and 33B, respectively, coil clockwise, whereas the coil pattern 42C formed on the green sheet 32B coils counterclockwise. Then, central ends and outer peripheral ends of the coil patterns are situated at the same positions except an outer peripheral end of the coil pattern 43C formed on an uppermost layer. In addition, similarly to the second embodiment, contact portions 51C and 53C are formed through the green sheets 31B and 33B at the central ends of the clockwise coil patterns 41C and 43C, and a contact portion 52C is formed through the green sheet 32B at the outer peripheral end of the counterclockwise coil pattern 42C.

Then, the green sheet 31B on which the clockwise coil pattern 41C exists and the green sheet 32B on which the counterclockwise coil pattern 42 exists are laminated in the alternate fashion, and the green sheet 33B on which the coil pattern is formed such that the outer peripheral end thereof reaches a side edge of the green sheet is laminated so as to constitute an uppermost green sheet layer having coil pattern formed thereon.

According to this construction, the central ends of the clockwise coil patterns 41C and 43C are caused to connect to the internal electrode 121 and the central end of the counterclockwise pattern 42C underneath those clockwise patterns by means of the contact portions 51C and 53C, whereas the outer peripheral end of the counterclockwise pattern 42C is caused to connect to the outer peripheral end of the coil pattern 41C laminated thereunder neath via the contact portion 52C, whereby the respective coil patterns are connected in series by means of the respective coil patterns 51C to 53C to thereby constitute an inductor 2C.

Thus, in the inductor 2C, the number of coils can be increased in response to the number of laminations, and the magnetic material patterns 6C are provided corresponding to the respective coil patterns 41C to 43C, whereby the magnetic permeability of portions where magnetic fluxes are formed can be increased to thereby obtain a greater inductance.

(Fourth Embodiment)

Figure 8:
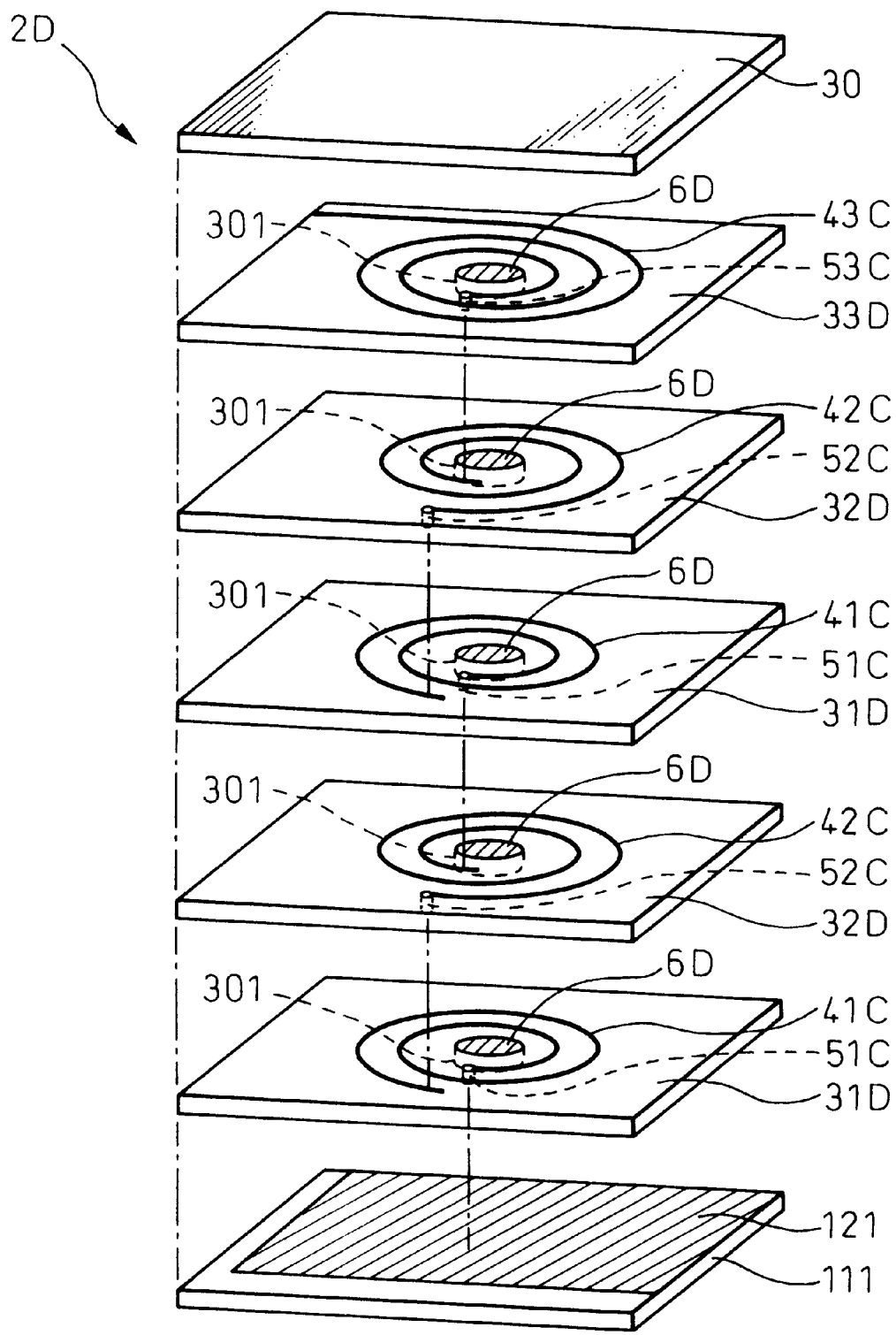
FIG. 8 is a perspective view showing a state in which green sheets are laminated when used in production of a piezoelectric element according to a fourth embodiment of the present invention.

A fourth embodiment of the present invention provides a piezoelectric element constructed similarly to that described in the first element thereof except for the inductor, which is constructed differently in this embodiment. An inductor provided in this embodiment is constructed similarly to that described in the third embodiment but with an enhanced permeability. FIG. 8 shows a state in which green sheets are laminated in producing a piezoelectric element according to this embodiment. The figure substantially illustrates an exploded state of the inductor. In the figure, portions having reference numerals like those described in the third embodiment substantially function similarly thereto, and therefore, only points different from the third embodiment will be described here.

Circular through holes 301 are formed in green sheets 31D to 33D which constitute dummy layers at substantially central portions thereof, and these holes are filled with electrically insulating magnetic powder so as to constitute respectively a magnetic material core 6D which is a magnetic material core having substantially the same thickness as that of the green sheets 31D to 33D. These through holes 301 can be formed by punching in a similar manner to that used to form the contact portions 51C to 53C. Next (or prior to the formation of the magnetic material cores 6D), coil patterns 41C to 43C and contact portions 51C to 53C are formed in similar manners as those used in the third embodiment.

Then, the green sheet 31D on which the clockwise coil pattern 41C and the green sheet 32D on which the counterclockwise coil pattern 42C is formed are laminated in an alternate fashion, and the green sheet 33D is laminated to constitute an uppermost layer having a coil pattern formed thereon on which green sheet 33D the coil pattern is formed whose outer peripheral end reaches a side edge of the green sheet.

In the inductor 2D formed as described above, the magnetic material cores 6D in all the layers are integrated so as to form a space where the permeability can be enhanced from a position where an internal electrode to a position where the uppermost coil pattern 43C is located in a continuous fashion, and therefore, a greater inductance can be obtained.

(Fifth Embodiment)

Figure 9:
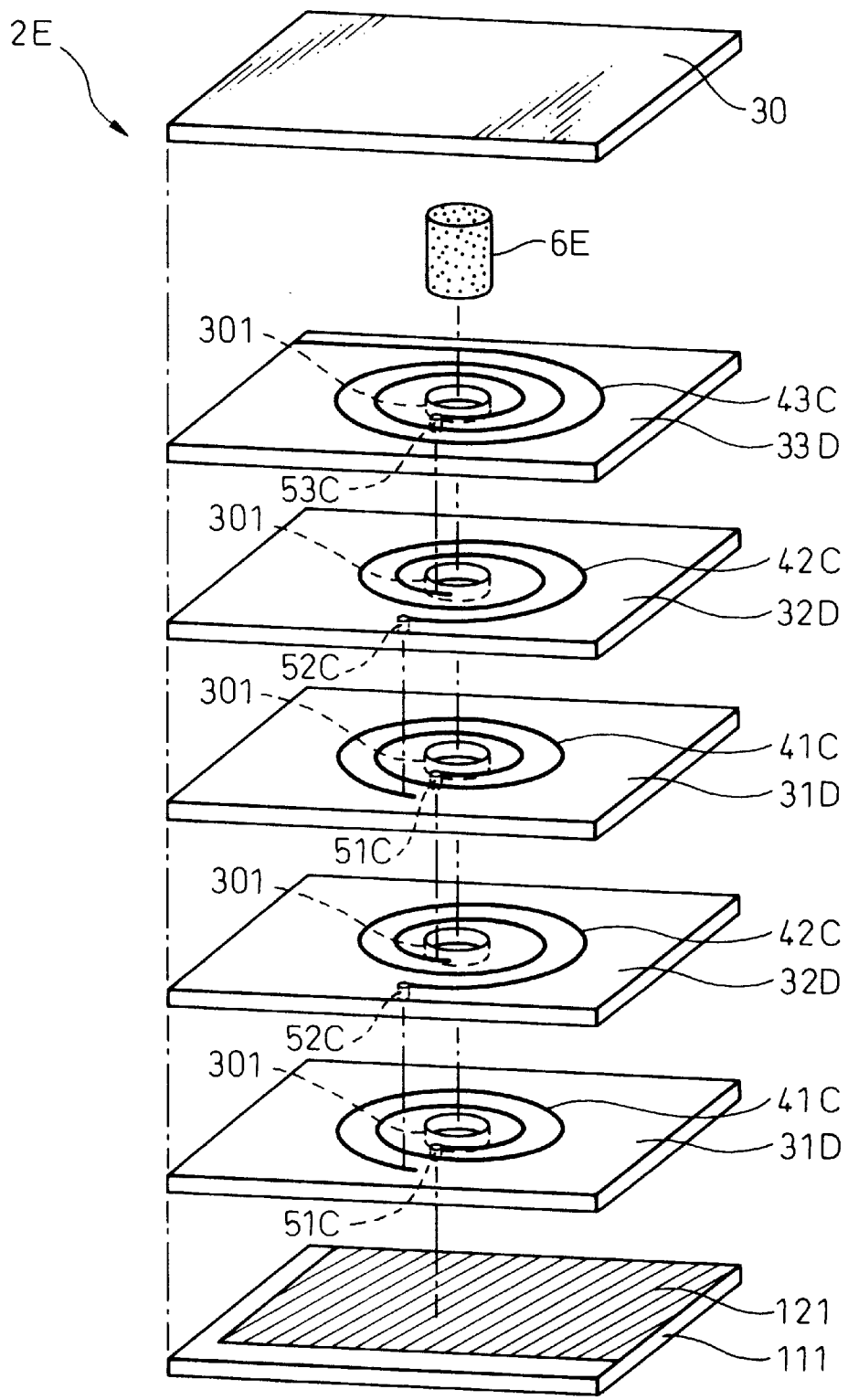
FIG. 9 is a perspective view showing a state in which green sheets are laminated when used in production of a piezoelectric element according to a fifth embodiment of the present invention.

A fifth embodiment of the present invention provides a piezoelectric element constructed similarly to that described in the first element thereof except for the inductor, which is constructed differently in this embodiment. An inductor proposed in this embodiment is a modified example from the inductor described in the fourth embodiment. FIG. 9 shows a state in which green sheets are laminated in producing a piezoelectric element according to this embodiment. The figure actually shows an exploded state of the inductor. In the figure, portions with reference numerals like to those described in the third and fourth embodiments function substantially the same as those, and therefore only what is different from the third and fourth embodiments will mainly be described here.

The difference between this embodiment and the fourth embodiment resides substantially only in the methods of production of piezoelectric elements. In the fourth embodiment, the through holes 301 in the green sheets 31D to 33D are filled with the electrically insulating magnetic powder so as to form the magnetic material cores 6D (FIG. 8), respectively, prior to the lamination of the green sheets 31D to 33D, but in this embodiment, coil patterns 41C to 43C and contact portions 51C to 53C are formed in green sheets 31D to 33D, and thereafter, the green sheets are laminated for integration. Through holes 301 constituted as a deep hole after the lamination of the layers are filled with electrically insulating magnetic powder at one time so as to form a magnetic material core 6E which is a magnetic material core material having a thickness substantially the same as that of the integrally laminated green sheets 31D to 33D.

Also in the inductor 2E formed as described above, a space occupied by the magnetic material core 6E for enhancing the magnetic permeability is formed continuously from a position where an internal electrode is provided to a position where the uppermost coil pattern 43C is located, thereby making it possible to obtain a greater inductance.

(Sixth Embodiment)

Figure 10:
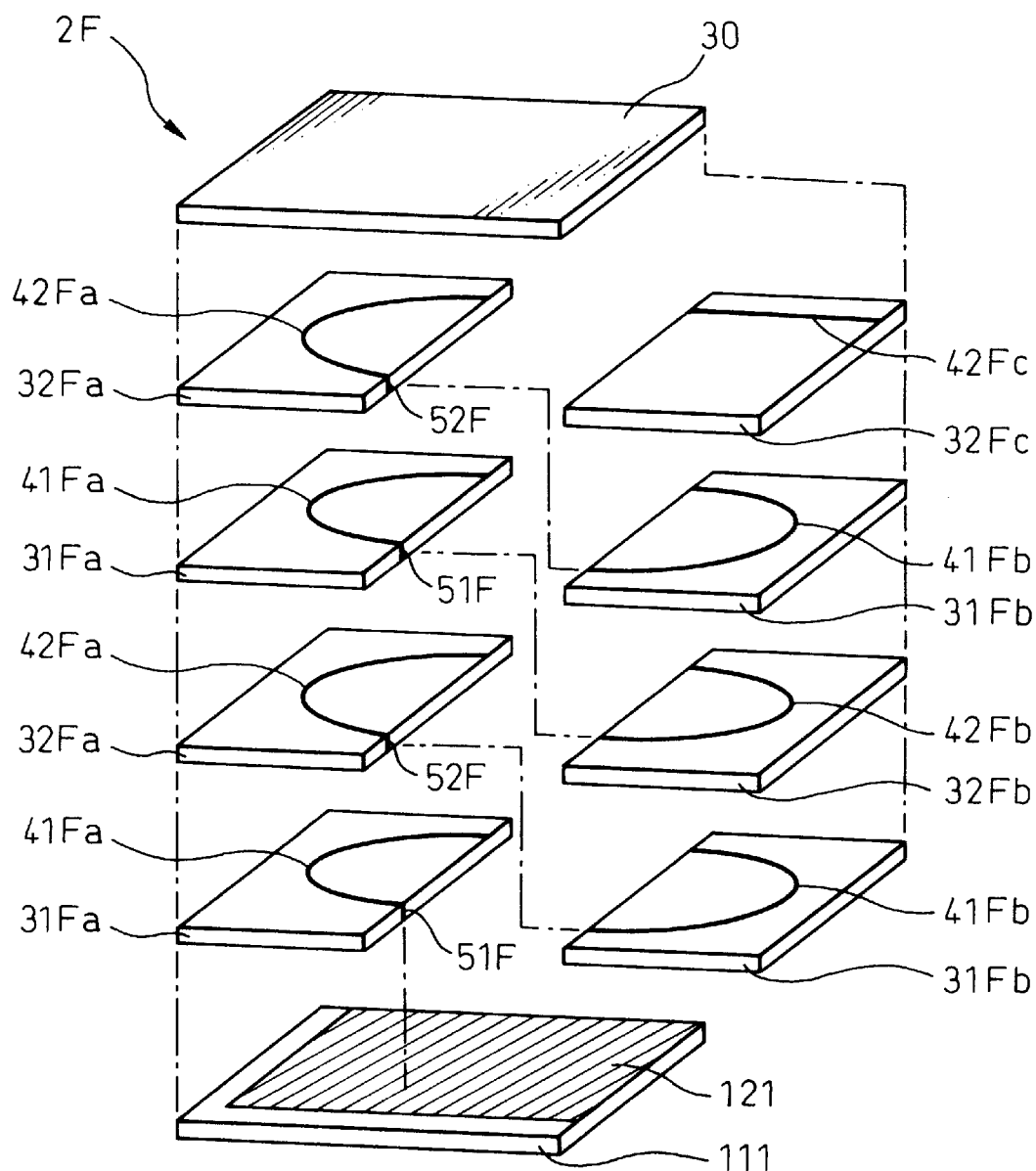
FIG. 10 is a perspective view showing a state in which green sheets are laminated when used in production of a piezoelectric element according to a sixth embodiment of the present invention.

A sixth embodiment of the present invention provides a piezoelectric element constructed similarly to that described in the first element thereof except for the inductor, which is constructed differently in this embodiment and, therefore only points different from the first embodiment will be described here. FIG. 10 shows a state in which green sheets are laminated in producing a piezoelectric element according to this embodiment. The figure illustrates substantially an exploded state of the inductor.

Green sheets 31F$a$, 31F$b$, 32F$a$, 32F$b$ and 32F$c$, half the size of a green sheet 111 used for a piezoelectric layer, are used as green sheets for use for dummy layers with two such layers being used for each layer, and each layer can be obtained using the production method described in the first embodiment. Conductor patterns 41F$a$, 41F$b$, 42F$a$, 42F$b$ and 42F$c$ are formed on the green sheets 31F$a$ to 32F$c$ using the screen printing process. As for the conductor patterns 41F$a$ to 42F$c$, semi-looped arc-like patterns 41F$a$ to 42F$b$ and a linear pattern 42F$c$ are provided.

In the arc-like patterns 41F$a$ to 42F$b$, the ends thereof reach, respectively, side edges of the green sheets 31F$a$ to 32F$b$ which face each other, and when the green sheets 31F$a$ and 31F$b$ and the green sheets 32F$a$ and 32F$b$, which constitute, respectively, an identical dummy layer are joined together, a single loop pattern is formed. However, the radius of curvature of the arc-like patterns 41F$a$ and 42F$a$ formed on the left-hand side green sheets 31F$a$ and 32F$a$, respectively, as viewed in the figure is slightly different from that of the arc-like patterns 41F$b$ and 42F$b$ formed on the right-hand side green sheets 31F$b$ and 32F$b$, respectively, as viewed in the figure, and the two arc-like patterns 41F$a$ and 41F$b$ and the two arc-like patterns 42F$a$ and 42F$b$ are, respectively, brought into abutment with each other only at one of the ends thereof, whereby the loops are open. In addition, there are provided two kinds of large and small radius of curvatures for the arc-like patterns, and the green sheet 31F*a* disposed on the left-hand side as viewed in the figure on which the arc-like pattern 42F*a* is formed and the arc-like pattern 32F*b* disposed on the right-hand side as viewed in the figure on which the arclike pattern 42F*b* is formed are laid so as to be symmetrical with each other across a line extending along the joining plane, whereas the green sheet 31F*b* disposed on the right-hand side as viewed in the figure on which the arc-like pattern 41F*b* is formed and the green sheet 32F*a* disposed on the left-hand side as viewed in the figure on which the arc-like pattern 42F*a* is formed are laid so as to be symmetrical with each other across a line extending along the joining plane.

Additionally, the green sheets 31F*a* to 32F*b* are laminated in a laminating direction such that the smaller and larger arc-like patterns 41F*a* to 42F*b* are disposed alternately in a repeated fashion, whereby the other ends of the arc-like patterns 41F*b* and 42F*b* formed on the right-hand side as viewed in the figure and the other ends of the arc-like patterns 42F*a* and 41F*a* formed on the left-hand side and thereabove respectively as viewed in the figure are disposed at opposite positions to each other across the green sheets 32F*a* and 31F*a* on which the same arc-like patterns 42F*a*, 41F*a* are formed.

Contact portions 52F, 51F are formed on the joining plane between the green sheets 32F*a*, 31F*a* at the other ends of the respective arc-like patterns 42F*a* and 41F*a* in such a manner as to vertically extend through the joining plane, whereby the arc-like patterns 41F*b* and 42F*b* formed on the right-hand side as viewed in the figure are caused to conduct to the arc-like patterns 42F*a* and 41F*a* formed thereabove and on the left-hand side as viewed in the figure. The contact portions 51F to 52F are formed by applying an Ag/Pd paste or the like to the joining plane between the green sheets 32F*a* and 32F*a*. Note that the other end of the arc-like pattern 41F*a* formed lowermost on the left-hand side is caused to conduct to the internal electrode 121 on the uppermost layer by means of the contact portion 51F.

The green sheet 32F*a* on which the arc-like pattern 42F*a* is formed and the green sheet 32F*c* on which the linear pattern is formed so as to extend across the surface thereof are combined together to thereby form an integrated uppermost green sheet having a complete conductor pattern. One end of this arc-like pattern 42F*a* is brought into abutment with one end of the linear pattern Fc, while the other end of the arc-like pattern 42F*a* is caused to conduct to the right-hand side arc-like pattern located directly therebelow via the contact portion 52F. The linear pattern 42F*c* conducts to an external electrode of one polarity, which is not shown.

Thus, a substantially spiral inductor 2F is formed which has a configuration similar to that of a solenoid coil.

Note that while, in this embodiment, the respective dummy layers are constituted by the two green sheets, a single integrated green sheet sized similar to that of the piezoelectric layers may be used so as to be laminated into an inductor. In this case, two sets of integrated loop-like patterns each constituted by the two arc-like patterns of the different radius of curvatures are provided on the integrated green sheet in a symmetrical fashion across a line corresponding to the joining plane between the green sheets for alternate lamination. Note that, as with the second embodiment, a through hole is formed in advance at positions corresponding to one ends of the patterns so as to penetrate the green sheets, and contact portions are formed at the time of screen printing so that the respective patterns between the layers can connect to each other.

Additionally, in the construction according to this embodiment, a magnetic member may be disposed in the vicinity of the coil pattern so as to improve the magnetic permeability of a portion where a magnetic flux is formed.

(Seventh Embodiment)

Figure 11:
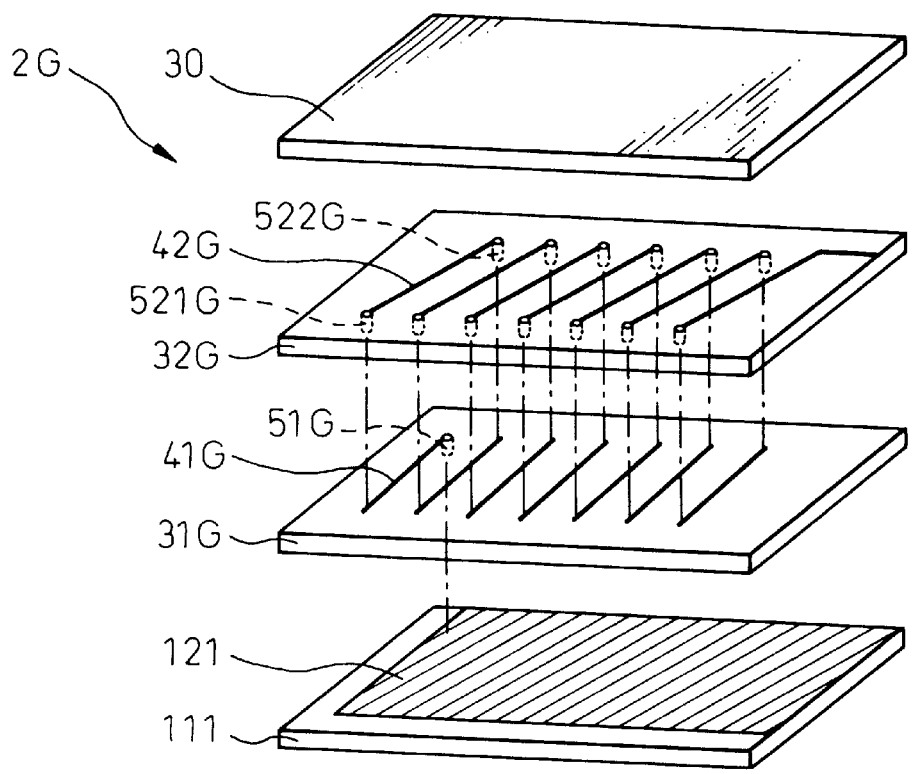
FIG. 11 is a perspective view showing a state in which green sheets are laminated when used in production of a piezoelectric element according to a seventh embodiment of the present invention.

A seventh embodiment of the present invention provides a piezoelectric element constructed similarly to that described in the first element thereof except for the inductor, which is constructed differently in this embodiment, and therefore only points different from the first embodiment will be described here. FIG. 11 shows a state in which green sheets are laminated in producing a piezoelectric element according to this embodiment. The figure illustrates substantially an exploded state of the inductor.

The same green sheet as that used for the piezoelectric layer is used for green sheets 31G and 32G constituting dummy layers, and the green sheet can be obtained by the production process described in the first embodiment. Conductive patterns 41G and 42G are formed on the green sheets 31G and 32G using the screen printing process. The conductive patterns 41G and 42G are formed into straight lines each extending transversely from a front side to a back side as viewed in the figure, and a plurality of such conductive patterns are provided at parallel positions in a longitudinal direction as viewed in the figure. In the illustrated example, the green sheet 32 on which the upper patterns 42G, which are a conductive pattern of a first kind, are formed is superposed on the green sheet 31G on which the lower patterns 41G, which are a conductive pattern of a second kind, are formed.

Then, described below will be a positional relationship between the lower patterns 41G and the upper patterns 42G. The lower patterns 41G and the upper lower patterns 42G are disposed in parallel at identical pitches, the respective upper patterns being disposed slightly diagonally relative to the respective near lower patterns 41G. A front-side end of the upper leftmost pattern 42G as viewed in the figure is located directly above a front-side end of the lower leftmost pattern 41G as viewed in the figure, and a back-side end of the upper leftmost pattern 42G as viewed in the figure is located directly above a back-side end of a lower second-leftmost pattern 41G as viewed in the figure, and this kind of positional relationship between the upper and lower patterns continues sequentially from the left to the right, whereby a front-side end of the upper pattern 42G disposed n-th from the left-hand side as viewed in the figure is located directly above a front-side end of the lower pattern 41G disposed n-th from the left-hand side in such a manner as to face each other across the green sheet 32G, while a back-side end of the upper pattern 42G so disposed is located directly above a back-side end of the lower pattern 41G disposed (n+1)th from the left-hand side across the green sheet 32G.

Through holes are formed in the green sheet 32G on which the upper patterns 42G are formed at positions corresponding to the ends of the same patterns before the patters are formed, and contact portions 521G and 522G are formed at the same time that the patterns are screen printed, whereby the lower patterns 41G and the upper patterns 42G are electrically connected to each other via the contact portions 521G and 522G when the green sheets 31G, 32G and 30 are superposed on one another. Thus, a coil is formed which comprises horizontal sides constituted by the lower patterns 41G and the upper patterns 42G and vertical sides constituted by the contact portions 521G and 522G, and when an electric current pusses through the coil, a magnetic flux is formed which penetrates the green sheet 32G in the longitudinal direction as viewed in the figure.

Additionally, a through hole is formed in the green sheet 31 on which the lower patterns 41G are formed at a position corresponding to a back-side end of the lower leftmost pattern 41G as viewed in the figure before the patterns are formed, and at the same time that the patterns are screen printed, a contact portion 51G is formed, whereby the lower leftmost pattern 41G and an internal electrode 121 in an upper most piezoelectric layer are caused to electrically conduct to each other via the contact portion 51G so formed.

In addition, a back-side end of the upper rightmost pattern 42G as viewed in the figure is bend into a hook, and the hooked end reaches a right-hand side edge of the green sheet 32G as viewed in the figure, whereby an electric conduction is secured between the hooked portion and an external electrode of one polarity, which is not shown.

In this embodiment, the number of coils increases as does the number of linear patterns, making it possible to enhance the inductance without increasing the number of dummy layers.

Note that in the respective embodiments described heretofore, the inductors are constructed so as to be laminated on the uppermost layer of the laminated portion of the piezoelectric layers and the internal electrodes, and therefore, the inductors can be fabricated substantially through a modification in which the number of laminations of the conventional piezoelectric element is increased. Moreover, the dummy layers are constructed so as to function also as the conductive layers so that the space can be saved. However, the present invention is not limited to the construction, but for example, the invention may be constructed such that the inductor is bonded to a position where the external electrode of one polarity is formed so that the conductive patterns and the external electrode of the one polarity can be caused to electrically connect via the contact portion.

What is claimed is:

1. A piezoelectric element having a laminated body of piezoelectric layers, wherein a voltage is applied across internal electrodes of positive and negative polarities from external electrodes so as to displace said laminated body, said piezoelectric element comprising an inductor provided at an intermediate position along a line connecting one of said external electrodes of one polarity with one of said internal electrodes of said one polarity.

2. A piezoelectric element, as set forth in claim 1, wherein said inductor comprises a plurality of insulating layers for incorporation with said laminated body of piezoelectric layers, and wherein a conductor pattern formed of a conductive material into a spiral or a loop is provided between said respective insulating layers.

3. A piezoelectric element, as set forth in claim 2, wherein said inductor comprises said conductive patterns and said insulating layers which are laminated alternately, said conductive patterns so laminated are electrically connected in series with each other by means of a contact portion which penetrates said respective insulating layers.

4. A piezoelectric element, as set forth in claim 2, wherein a magnetic member is provided close to said conductor pattern between said insulating layers.

5. A piezoelectric element, as set forth in claim 4, wherein said magnetic member is a magnetic material pattern formed between said insulating layers.

6. A piezoelectric element, as set forth in claim 4, wherein said magnetic member is a magnetic material core which penetrates said insulating layers.

7. A piezoelectric element, as set forth in claim 2, wherein said insulating layers are constituted by the same material as said piezoelectric layers.

8. A piezoelectric element, as set forth in claim 2, wherein said insulating layers are each constituted by a magnetic member.

9. A piezoelectric element, as set forth in claim 2, wherein said insulating layers are laminated together with said piezoelectric layers so as to cover said internal electrode in the uppermost piezoelectric layer.

10. A piezoelectric element, as set forth in claim 1, wherein said inductor comprises three or more insulating layers that are laminated on one another so as to be incorporated with said laminated body of piezoelectric layers, wherein a plurality of conductor patterns of a first kind, which are each formed linearly of a conductive material, are provided in parallel between first inter-layer portions of said insulating layers, while a plurality of conductor patterns of a second kind, which are each formed of a conductor pattern linearly and diagonally relative to said conductor patterns of the first kind, are provided between second inter-layer portions in such a manner that each of said conductor patterns of the second kind extends from a position facing one end of one of said conductor patterns of the first king across said insulating layers to a position facing one end of an adjacent conductor of said conductors of the first kind across said insulating layers, whereby said respective conductor patterns of the first kind and said respective conductor patterns of the second kind are caused to electrically connect to each other at ends thereof by means of contact portions which penetrate said insulating layer.

* * * * *